(12) United States Patent
Kaifu (10) Patent No.: US 6,191,411 B1
(45) Date of Patent: Feb. 20, 2001

(54) PHOTOELECTRIC CONVERSION APPARATUS HAVING DRIVE DETECTION CAPABILITIES

(75) Inventor: Noriyuki Kaifu, Hachiohji (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/054,465

(22) Filed: Apr. 3, 1998

(30) Foreign Application Priority Data

Apr. 8, 1997 (JP) .................................................. 9-089284

(51) Int. Cl.⁷ ...................................................... H01J 40/14
(52) U.S. Cl. ...................... 250/214 R; 250/551; 250/214
(58) Field of Search .......................... 250/214 R, 214 C, 250/208.1, 208.2, 208.5, 551

(56) References Cited

U.S. PATENT DOCUMENTS

| | | | |
|---|---|---|---|
| 4,745,488 | 5/1988 | Kaifu et al. | 358/294 |
| 4,926,058 | 5/1990 | Iwamoto et al. | 250/578.1 |
| 5,060,040 | 10/1991 | Saika et al. | 357/30 |
| 5,189,307 | * 2/1993 | Fabian | 250/551 |
| 5,233,442 | 8/1993 | Kawai et al. | 358/482 |
| 5,272,548 | 12/1993 | Kawai et al. | 358/482 |
| 5,317,406 | 5/1994 | Kobayashi et al. | 348/307 |
| 5,335,094 | 8/1994 | Kaifu et al. | 358/494 |
| 5,514,875 | * 5/1996 | Krause | 250/551 |
| 5,517,035 | * 5/1996 | Krijnties | 250/551 |
| 5,812,109 | * 9/1998 | Kaifu et al | 345/104 |
| 5,812,284 | * 9/1998 | Mizutani et al. | 358/482 |
| 5,841,180 | * 11/1998 | Kobayashi et al. | 257/448 |
| 5,914,485 | * 6/1999 | Kobayashi et al. | 250/208.1 |

* cited by examiner

Primary Examiner—John R. Lee
(74) Attorney, Agent, or Firm—Fitzpatrick, Cella, Harper & Scinto (57) ABSTRACT

A photoelectric conversion apparatus alternate-currently separates a reference electrical potential of a photoelectric conversion unit having the drive detection circuits 102, 202 for driving the sensor substrates 101, 201 of which a plurality of photoelectric conversion elements are arranged on an insulating substrate and the photoelectric conversion elements, and for detecting signals from the photoelectric conversion elements, and a reference electrical potential of the control unit 3 for controlling the the photoelectric conversion unit. As a result of this, a reduction of a noise could be achieved.

16 Claims, 8 Drawing Sheets

PHOTOELECTRIC CONVERSION APPARATUS HAVING DRIVE DETECTION CAPABILITIES

BACKGROUND OF THE INVENTION

1. Field of the Invention

The present invention relates to a photoelectric conversion apparatus for forming an image by a radioactive ray such as a visible light or an X-ray, and for example, to a photoelectric conversion apparatus adapted to be used for a photoelectric conversion apparatus of one-dimension or two-dimension such as a still camera or a radioactive-ray image pickup apparatus.

2. Description of the Related Art

In convention, as said to be a photograph, a silver-salt photograph which uses an optical camera and a silver-salt film has occupied the major portion of the photographs. Even though the semiconductor technologies have been developed and the photoelectric conversion apparatuses have been developed which are capable of taking pictures of the images of motion pictures such as a video cam corder by using a solid state image sensing device using a Si single crystal as represented by the CCD type sensor, the MOS type sensor, these images can not be better than the silver-salt photograph with respect to the number of pixels as well as to the S/N ratio, and thus it has been common to use the silver-salt photographs for taking the static images thereinto.

Recently, the demands for image processing by a computer, a retention by an electronic file, and an image transmission by electronic mail have increased, and it is desired to have an electronic image pickup apparatus which outputs as a digital signal of similar quality to the silver-salt photograph image. This can be equally applied to not only the general photographs but also the fields of medical service and non-destructive inspection.

In the field of medical service an X-ray photograph is known as the one that uses a silver-salt photograph technology. This is the one in which an X-ray radiated from an X-ray source is irradiated to the diseased part of a human body, and with the information of that transmission, for example, it judges whether or not there is a broken bone or a tumor, and has been used for the medical diagnoses for a long time. (This can be said to be one the non-destructive inspections). Usually, the X-ray transmitted through the diseased part is to be incident once on a wavelength conversion unit such as a fluorescent material, and is converted to a light of the sensitive wave region such as a visible light, and then is exposure on the silver-salt film. Although the silver-salt film has advantages such as the silver-salt film has a goood sensitivity, and also has a high quality of resolution, but it has problems such as taking too much time for a development, taking a lot of time and labor for a retention/a management, and not readily to transmitted to a remote area, and the like, and thus it is desired to have an electronic X-ray image pickup apparatus which outputs the digital signal not of similar quality to the silver-salt photograph image as described above.

However, there still remains some points which should be improved in order to electronically read the X-ray images or the images converted from the X-rays and to use them as data for the medical service and/or non-destructive testing.

That is, it is needed to consider the problems of noises which could be added to the data, when adopting the electronic data. By adopting the noises with the image data, there is the possibility of resulting damage to the the medical diagnoses and/or the diagnoses of the structures by the non-destructive inspections.

Further, not only for the problem of noise, but also for reducing an exposure quantity to the human body, much high sensitive photo-electric conversion apparatus is required.

SUMMARY OF THE INVENTION

Accordingly, it is an object of the present invention to provide a photoelectric conversion apparatus with the reduced noise and the high sensitivity, and its system.

Another object of the present invention is to provide a photoelectric conversion apparatus comprising:

a photoelectric conversion unit having a drive detection circuit for driving a sensor substrate of which a plurality of photoelectric conversion elements are arranged on an insulating substrate and said photoelectric conversion elements, and for detecting signals from said photelectric conversion elements; and a control unit for controlling said photoelectric conversion unit, wherein a reference electrical potential of said photoelectric conversion unit and a reference electrical potential of said control unit are alternate-currently separated.

Yet another object of the present invention is to provide a photoelectric conversion system comprising:

a photoelectric conversion unit;

said photoelectric conversion unit having a plurality of photoelectric conversion elements, a drive detection circuit being driven with a first reference electrical potential for driving said photoelectric conversion elements and for obtaining outputs from said photoelectric conversion elements, a control unit;

said control unit having a circuit, being provided separately from said photoelectric conversion unit and being driven with a second reference electrical potential for controlling said photoelectric conversion unit, wherein, said first reference electrical potential and said second reference electrical potential are alternate-currently separated such that a frequency equal to or more than a frequency corresponding to a read cycle of said photoelectric conversion unit is removed.

For an electronification of an X-ray image pickup apparatus, for example, it has been considered a development of a photoelectric conversion apparatus using large-scale sensors of which image pickup elements using photoelectric conversion elements of hydrogenated amorphours-silicon (hereinafter, referred to as a-Si) on an insulating substrate are arranged in two-dimensions. The photoelectric conversion apparatus of this type is capable of individually detecting charges flown in a reversed direction of an individual diode, by forming semiconductor diodes by depositing metals and/or a-Si on an insulating substrate whose edge is about 30–50 cm by using a sputtering apparatus and/or a chemical vapor deposition apparatus (CVD apparatus) and the like, and then by applying an electric field of a reversed bias to the semiconductor diodes of the numbers of 2000×2000, by also a thin-film transistor (hereinafter, referred to as a TFT) simultaneously formed-in. Since it is well known that a photocurrent which corresponds to a light quantity incident on the semiconductor layer will flow by applying an electric field of a reversed direction to a semiconduuctor diode, this is utilized therefor. In contrast to a photoelectric conversion apparatus with a single crystal, which can be formed in a small size only, because the a-Si can form the photoelectric conversion elements on such a large area whose one edge is 30–50 cm, the photoelectric conversion apparatus with a size equivalent to a size of a diseased part of a human body is possible, thereby using a lens and the like without using a minature optical system, directly forming a wavelength conversion unit such as a fluorescent material and the like on the image pickup elements, and a light which is converted (in particular efficiently) to a detectable wavelength of the photoelectric conversion element, emitted by the fluorescent material, can be utilized with a high efficiency. Further, it is possible to directly detect the X-ray by the layer within the photoelectric conversion element without using the fluorescent material if taking the design of the light receiving area into consideration.

When forming an image by using the minature optical system in the phtoelectric conversion apparatus of the small size which uses the single crystal, only about $\frac{1}{1000}$ of the light emitted from the fluorescent material can be utilized because of the loss of the optical system and the like. Also, in case of observing the human body with the X-ray, it is required to take a photograph thereof with as weak an X-ray as possible. Accordingly, it is very difficult to implement a high quality X-ray diagnostic apparatus for a medical service by a small size photoelectric conversion apparatus using a minature optical system with a low utilization efficiency of the light, and thus it becomes possible to provide a desired X-ray diagnostic apparatus for a medical service by using a sensor substrate with a large area on which a large number of photoelectric conversion elements, which can utilize the X-ray with a high efficiency and also obtain a high S/N ratio, are arranged two-dimensionally.

Figure 1:
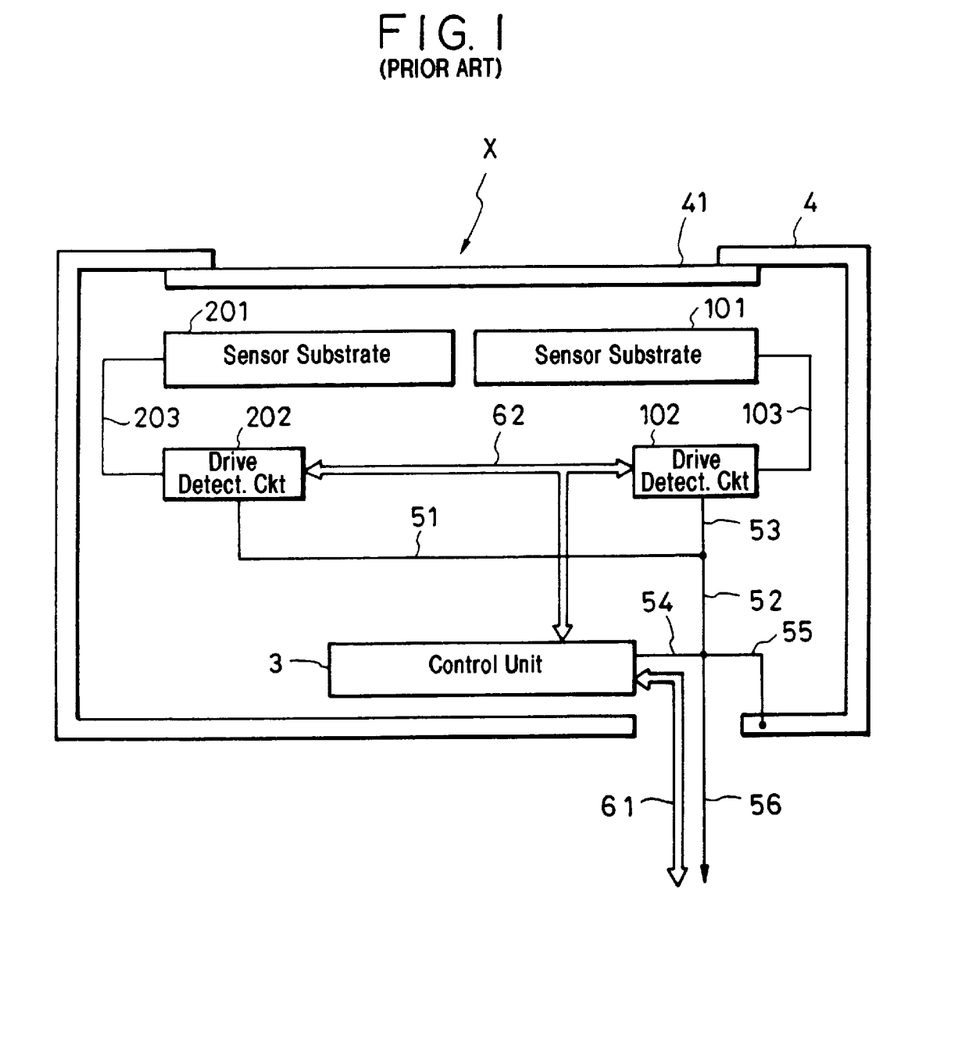
FIG. 1 is a schematical cross-sectional diagram illustrating one example of the photoelectric conversion apparatus according to the present invention.

FIG. 1 shows a schematic cross-sectional configuration diagram of an X-ray diagnosis apparatus for a medical service using a sensor substrate of a large area. In the figure, numerals 101, 201 refer to sensor substrates on each of which a plurality of photoelectric conversion elements are arranged two-demensionally on an insulating substrate, numerals 102, 202 refer to drive detection circuits for driving the sensor substrate 101, 201, and also for detecting the outputs of the sensor substrates, which are obtained as the result of driving. The sensor substrates 101, 201 are drive-controlled from the drive detection circuit 102, 202 by a plurality of wiring groups 103, 203 including wirings of a reference electrical potential, or transmit the obtained outputs to the drive detection circuit 102, 202. In the apparatus shown in FIG. 1, a pair of photoelectric conversion units are constituted by the sensor substrates 101, 201, the drive detection circuits 102, 202, and the wire groups 103, 203. On the sensor substrates 101, 201, the fluorescent materials are formed although they are not shown, and convert the X-rays including the information of an internal structure such as a human body, which are incident from an upper surface direction thereof to the visible lights, and the visible lights are detected as the electrical signals at the photoelectric conversion units. A pair of these photoelectric units are controlled by the control unit 3. The above mentioned control unit includes the circuits such as a CPU, a memory, an A/D converter and the like which deal with the signals that do not possess a synchronization with a line read scanning of the sensor substrate and/or a frame cycle, and is required for driving the sensors, but these operations could easily turn out to be the noise source for the sensor's operations, and thus it is desirable to place this circuit apart from the photoelectric conversion units. This circuit also provides a logic and/or an electrical potential commonly used for the plurality of photoelectric conversion units. On the other hand, the drive detection circuit is a circuit which produces the electrical potential to be provided for inside of the sensor, controls a control line of an internal switch, amplifies and/or serializes a very small sensor output, and directly influences the operation of the photoelectric conversion elements, and thus is desirable to be structured near the sensor substrates. In the control detection wire groups 61, 62, the control/detection wires required for a control and a detection of the photoelectric conversion units are included, and the control detection wire group 61 connects the control unit 3 with the outside, and the control detection wire group 62 connects the drive detection circuit 102, 202. Further, from the power supply wire groups 51, 52, 53, 54 and 56, the power supply is transmitted from the outside or the control unit 3 to the drive detection circuit 102, 202 of the photoelectric conversion unit. Among these power supply wire groups, a reference electrical potential line (hereinafter, referred to as a GND wire) which supplies a reference electrical potential as a referece for an entire apparatus to each part is included. Numeral 55 refers to the GND wire among each wire group and is connected to a metal enclosure 4. The metal enclosure 4 is constituted by a conductive metal such as iron, and is formed so as to cover the photoelectric conversion units and the control unit 3. However, a front face of the sensor substrates 101, 201 is formed with for example a carbon fiber plate 41 knitted with a carbon fiber surface so as not to obstruct an incident of the X-rays (X) and functions as a part of the enclosure. The carbon fiber plate 41 has conductivity and is electrically connected with the metal enclosure 4. That is, by the metal enclosure 4 and the carbon fiber plate 41, the photoelectric conversion unit and the controller unit 3 are covered with the conductive enclosure therearound, and are less influenced by an electrostatic noise and/or radio wave noise from the outside thereof.

However, with the above described configuration, because of using the sensor substrates with the large area, the X-ray can be utilized with a high efficiency, but there is a possibility of creating problems as described in the following.

A first problem is that since the sensor substrates 101, 201 have the large areas, a capacitive coupling with the conductive enclosure is very large, and thus if the conductive enclosure is slightly shifted with respect to the reference electrical potential within the sensor substrates, it would be influenced substantially.

A second problem is that since the photoelectric conversion elements which readily receive a noise are formed on the insulating substrates, a stray capacitance can exist between the conductive enclosure. In a case of a single crystal photoelectric conversion element formed on the semiconductor substrate, the stray capacitance has a very large capactance between the semiconductor substrate which actually works as a conductor. Other than between the conductive enclosure, the stray capacitance with the conductive enclosure can be ignored, and even if the electrical potential of the conductive enclosure is shifted with respect to the photoelectric conversion elements, a current thereof flows mostly within the semiconductor substrates and does not significantly influence the photoelectric conversion elements. Further, an electrical potential of each part of the photoelectric conversion elements is rarely shifted since the capacitance between the semiconductor substrate is several times larger than the capacitance of the conductive enclosure.

On the other hand, for the photoelectric conversion elements formed on the insulating substrates, since the stray capacitances are mostly with the conductive enclosure, if the electrical potential of the conductive enclosure is shifted, a current thereof is added to an output current of the photoelectric conversion element, and influences a movement of each part. Otherwise, together with the electrical potential of the conductive enclosure, the electrical potentials of the photoelectric conversion elements and/or each part are shifted with the electrical potential of the conductive enclosure. Particularly, in a case of the X-ray diagnosis apparatus for the medical service and the like, it is preferable to make a distance between an object and the sensor substrates 101, 201 as short as possible in order to reduce the influence of a dim which occurrs by arranging the X-ray source that is not a point source of light and to make a dim of the scattering X-ray emitted from the object to be small. For this reason, the distance between the carbon fiber plate 41 as described above and the sensor substrates 101, 201 is very short as if they are contacting each other. Accordingly, the stray capacitances between the carbon fiber plate 41 and the photoelectric conversion elements within the sensor substrates 101, 201 would turn out to be much larger. Because the photoelectric conversion elements are formed on the insulating substrates and constitute the sensor substrates 101, 201, other capacitance rarely exists, and thus it may be thought that all of the stray capacitances would be made between with the carbon fiber plate 41, i.e., with the conductive enclosure. This is also a reason why it is influenced largely when the conductive enclosure slightly shifts with respect to the reference electrical potential within the sensor substrates.

A third problem is that because the shape of the apparatus is large, the wires for connecting the respective parts turn out to be longer, and thus the wires do not work as ideal wires and possess resistance therewith. This indicates that the electrical potentials would be generated within the wires as current flows through the wires, and causes the noise.

Figure 2:
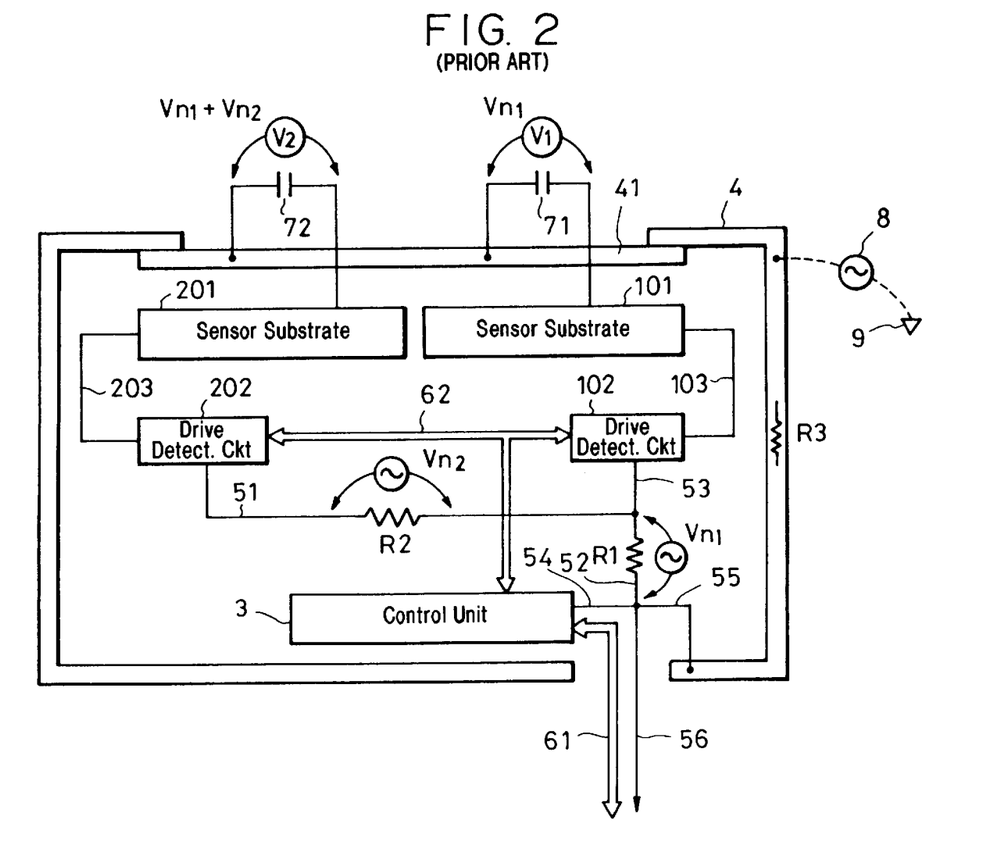
FIG. 2 is a schematical cross-sectional diagram illustrating one example of the photoelectric conversion apparatus according to the present invention.

Referring to FIG. 2 these problems will be described in detail. FIG. 2 is a diagram of the capacitor, resistor and the noise that become the problem are added in the wiring to the schematical cross-sectional configuration diagram of the X-ray diagnosis apparatus for the medical service of FIG. 1 as described above. In FIG. 2, for the respective parts which are the same as the ones in FIG. 1, the corresponding parts are marked with the same symbols, and then the descriptions thereof are omitted.

The capacitances 71, 72 are respectively capacitances of the internal electrical potential line of the sensor substrates 101, 201 and the carbon fiber plate 41 which is a part of the conductive enclosure. R1, R2 schematically indicates the resistance values of the GND wires within the wire groups 52, 51 respectively. R3 schematically indicates a resistance of the metal enclosure 4. There also exists, the capacitances for other repective parts, and the resistances for parts other than the wire groups and the GND wire, but they are omitted here for a simplification, and it will be described only with the capactances, resistances shown in the figure. A numeral 9 schematically indicates an electrical potential of the ground with a symbol, and is an electrical potential of a floor and/or a wall in a working environment. Usually, these electrical potentials do not match with the reference electrical potential within the system, and influence the electrical potential of the conductive enclosure with the capactance existing between the conductive enclosure. Further, the noise electrical potentials are also added according to the radio waves and the electrostatic noise generated from the external apparatus. By putting these together, it is shown as the noise power source 8 in FIG. 2. The electrical potential of the metal enclosure 4 is electrically connected to the reference electrical potential by the GND wire 55 in order to reduce the influence of this noise power source 8.

Dissipation currents flow in the drive detection circuit within the photoelectric conversion unit by the operations of the logic circuit and the analog amplifier, and flow within the sensor substrates by the operations of the respective parts, also these dissipation currents fluctuate. Since the parts of these dissipation currents flow to the resistances R1, R2 within the wire group, alternating-current electrical potentials are generated between the terminals of the respective resistances, and are shown as Vn1, Vn2 in the figure. The metal enclosure 4 is connected to the reference electrical potential within the wire group 56 by the GND wire 55. Further, since the carbon fiber 41 is electrically connected to the metal enclosure 4, it turns out to have an idential electrical potential as the metal enclosure 4. That is, the electrical potential of the carbon fiber 41 becomes the reference electrical potential within the wire group 56, and on the other hand, the reference electrical potential within the drive detection circuit 102 shifts by Vn1 and within the drive detection circuit 202 it shifts by (Vn1+Vn2). Then, thereby the reference electrical potential within the sensor substrate 101 possesses an electrical potential difference of Vn1 with respect to the carbon fiber plate 41, and the reference electrical potential within the sensor substrate 201 possesses an electrical potential difference of (Vn1+Vn2) with respect to the carbon fiber plate 41. Since there exists the capacitances 71, 72 between the carbon fiber plate 41 and the internal electrical potential lines within the sensor substrates 101, 201, an alternate current flows by possessing the alternating-current electrical potentials Vn1 and/or (Vn1+Vn2), this current influences the sensor output as noise. Further, this alternate current generates an alternating electrical potential through the capacitance and the resistance and this also influences the respective parts as noise. Noise would influence more significantly if there exists a plurality of sensor substrates within the same conductive enclosure. Since there exists an alternating electrical potential difference Vn2 between the reference electrical potential of the sensor substrate 101 and the reference electrical potential of the sensor substrate 201 although adjusting an electrical potential by inventing some means of determining the electrical potential of the conductive enclosure in order to lessen the influences of these noises, the influence of the electrical potential of the conductive enclosure (it is the carbon fiber plate 41 in FIG. 2) can not be avoided, and as a result it influences the sensor output as a noise. This influence puts the sensor substrates together and constitutes the photoelectric conversion apparatus with much larger area, and thus it has been difficult to obtain a performance with a high S/N. Actually, besides these, an influence of the noise power source 8 is caused by the resistance R3 of the metal enclosure 4, and a complex noise is generated by a resistance and/or an inductance and/or a stray capacitance (not shown). This noise causes to deterioration of detection ability of an entire apparatus, i.e., a sensitivity that is so-called a S/N ratio. This influences on the diagnoses of the medical service and the internal structure.

In the present invention, in order to solve such problems, the reference electrical potential of the photoelectric conversion unit and the reference electrical potential of the control unit are alternating-currently, separated.

That is, by alternating-currently separating the reference electrical potential of the photoelectric conversion unit and the reference electrical potential of the control unit, an alternating electrical potential difference between the conductive enclosure and the reference electrical potentials within the sensor substrates is not possessed, and as a result it can provide the photoelectric conversion apparatus and system of reduced noise, i.e., of high sensitivity.

Further, by including a transmission element for transmitting control and detection signals of the photoelectric conversion unit and the control unit, the control signal and the detection signal can be transmitted between the photoelectric conversion unit and the control unit while alternating-currently separating the photoelectric conversion unit and the control unit.

DESCRIPTION OF THE PREFERRED EMBODIMENTS

Figure 3:
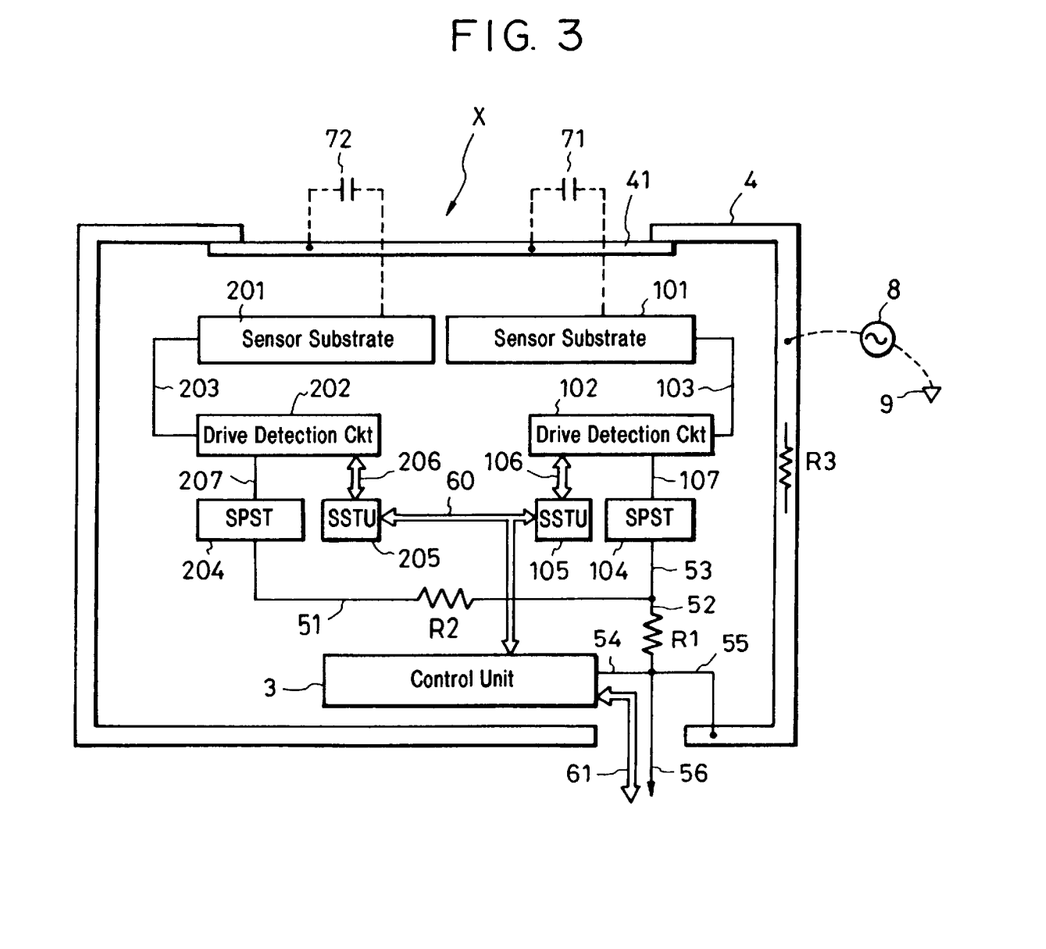
FIG. 3 is a schematical cross-sectional diagram illustrating one example of the photoelectric conversion apparatus according to the present invention.
Figure 4:
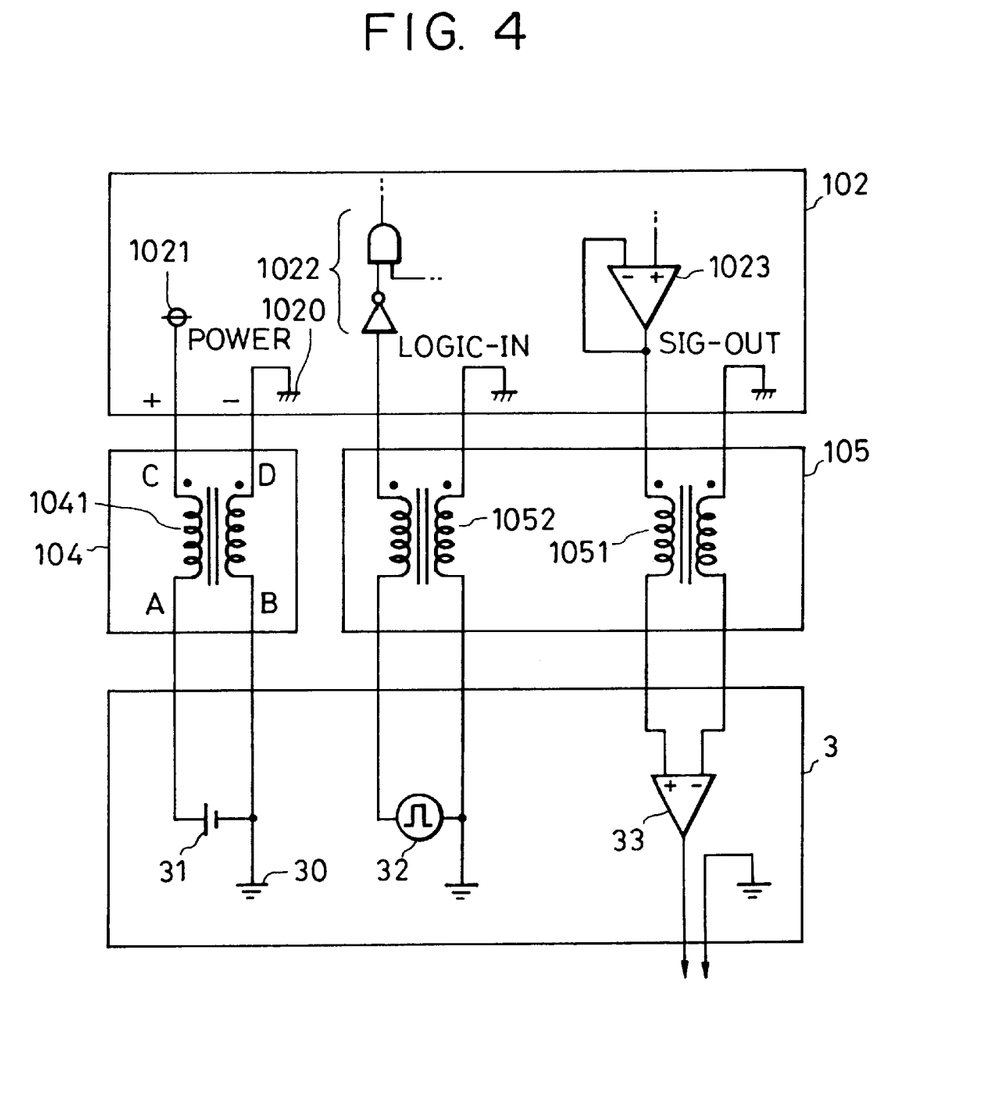
FIG. 4 is a schematical circuit diagram illustrating one example of a circuit configuration suitable for the phoelectric conversion apparatus according to the present invention.

In the following, the preferred embodiments of the present invention will be described in detail with reference to the accompanying drawings. FIG. 3 is a schematical cross-sectional diagram of a photoelectric conversion apparatus according to the present invention, and FIG. 4 is a schematical circuit diagram of the drive detection circuit 102, the alternating-currently separation power supply transfer unit 104, the alternating-currently separation signal transfer unit 105, and the control unit 3 shown in FIG. 3. In these figures, the corresponding parts for the identical respective parts in FIG. 1 are marked with the identical symbols.

The numerals 101, 201 in FIG. 3 indicate respectively a sensor substrate of which a plurality of photoelectric conversion elements are arranged two-dimensionally on an insulating substrate, and which has a light-receptive area with a large area whose one edge is about 20 cm. Using a glass substrate as the insulating substrate, forming a metal thin film of Al and/or Cr with a sputtering apparatus, on this glass substrate by using a thin-film technology, depositing an i-layer, a n-layer and occasionally a p-layer of the hydrated amorphous silicon semiconductor layers, also depositing an insulating thin film layer with a silicon nitride (SixNy), photoelectric conversion elements and a thin film transistor so-called a TFT, and a capacitance of a MIS type are formed. When a light is incident on a sensor substrate, a current flow in these photoelectric conversion elements is output directly, or the electrical potential of the capacitance and the current flow out are output by accumulating in the capacitance temporary and by sequentially switching with the TFT. The electrical potential of this occasion is output for the reference electrical potential obtained with the metal thin film such as Al formed within the substrate, and also the current might be a current which flows to an electrode of the referece electrical potential. If this reference electrical potential has an electrical potential difference with an ambient electrical potential, i.e., an electrical potential of the carbon fiber 41 in the present embodiment, then a current will flow through a stray capacitance, or an electrical potential of a capacitance which has an electrode of the reference in an opposite electrode will fluctuate, thereby influencing an output as noise.

The numerals 102, 202 indicate the drive detection circuits which determine the electrical potentials within the sensor substrates 101, 201, drive the photoelectric conversion elements by controlling the switching of the TFT, and also detect the outputs of the sensor substrates obtained as the result of driving. The sensor substrates 101, 201 are drive-controlled from the drive detection circuits 102, 202 by the plurality of wire groups 103, 203 including the wires of the reference electrical potentials, and also transmit the outputs obtained to the drive detection circuits 102, 202. In the wire groups 103, 203, the drive signal lines for driving the sensor substrates 101, 201, the signal lines for transmitting the signals detected in the sensor substrates 101, 201 to the drive detection circuits 102, 202, and the power supply lines for supplying the powers to the sensor substrates 101, 201 are included besides the reference electrical potential lines (hereinafter, referred as the GND wires) which supply the reference electrical potentials. In the present embodiment, as shown in FIG. 3, a pair of photoelectric conversion units are constituted by the sensor substrates 101, 201, the drive detection circuits 102, 202, and the wire groups 103, 203. In the present embodiment, an X-ray image pickup apparatus capable of being used for a medical service is constituted, of which the fluorescent materials (not shown in detail) are formed in the upper parts of the sensor substrates 101, 201 and convert the X-rays including the information of internal structure such as a human body which are incident from the upper surface direction to visible lights, and the photoelectric conversion units enable detection of them as electrical signals.

This pair of photoelectric conversion units are controlled by the control unit 3, but the control unit 3 and the power supply wire groups 51, 52, 53, 54, 56 transfer power to the wire groups 107, 207 through the alternating-currently separation power supply transfer unit 104, 204, and supply power to the drive detection circuits 102, 202. Further, a drive detection line group 60 from the control unit 3 is transferred to the wire groups 106, 206 through the alternating-currently separation signal transfer unit 105, 205, and the drive signals are transferred to the drive detection circuit 102, 202. Also, the detection signals are, by the reversed paths, from the drive detection circuits 102, 202, by the wire groups 106, 206, through the alternating-currently separation signal transfer unit 105, 205, transferred to the drive detection wire group 60, and transmitted to the control unit 3. At this moment, the alternating-currently separation power supply transfer unit 104, 204 and the alternating-currently separation signal transfer unit 105, 205 transfer the power of power supply and the various types of signals, but has an ability of alternating-currently separating the electrical potentials of the control unit 3 and the drive detection circuits 102, 202, in particular the reference electrical potentials. Although the reference electrical potential lines (GND wires) for supplying the reference electrical potentials are also included in the power supply wire groups 51, 52, 53, 54, 56, these wires would, on the contrary to the designer's intention, not have 0 ohm resistance, but have about 0.1 ohms resistance. It is better not to have this resistance, but it is difficult to eliminate the resistance completely. In FIG. 3, the resistances eventually present in the each of the GND wires of the power supply wire groups 51 and 52 are schematically shown as R1, R2, respectively. In other wire groups and other than the GND wires, the resistances exist, but they are omitted in FIG. 3. A numeral 55 inidicates a GND wire among the respective wire groups and is connected to the metal enclosure 4. The metal enclosure 4 is constituted of a conductive metal, for example an iron, is formed so as to cover the photoelectric conversion units and the control unit 3. However, a front surface of the sensor substrates 101, 201 is formed with a carbon fiber plate 41 knitted by a carbon fiber in order to not obstruct an incident of the X-rays, and functions as a part of the enclosure. This carbon fiber plate 41 is tightly attached to the sensor substrates 101, 201 by sandwiching a fluorescent material (not shown) therebetween in order to make a dim of an image obtained as to be small. (In FIG. 3, it is described as if there is a space therebetween for a convenience of the drawing, but actually it is tightly attached). The carbon fiber 41 has a conductivity and is electrically connected to the metal enclosure 4. That is, the surroundings of the photoelectric conversion units and the control unit 3 are covered by the conductive enclosure with the metal enclosure 4 and the carbon fiber plate 41, and is configured as to be not easily influenced for the electrostatic noise 8 and the radio wave noise for the ground 9 from the outside. It is desirable that the metal enclosure 4 has 0 ohm resistance, but actually, it has some resistance as indicated by R3. Between the carbon fiber plate 41 and the sensor substrates 101, 201, the capacitances 71, 72 are possessed since the sensor substrates 101, 201 have large areas as one edge thereof being 20 cm. These capacitances are large because of the sensor substrates 101, 201 having large areas and being tightly attached, and also the most of the stray capacitances of the respective parts of the photoelectric conversion elements approach these capacitances because of the sensor substrates 101, 201 forming the photoelectric conversion elements on the insulating substrates.

FIG. 4 schematically shows the configurations of the alternating-currently separation power supply transfer unit 104 and the alternating-currently separation signal transfer unit 105, as well as the parts of the configurations of the drive-detection circuit 102 and the control unit 3. The reference electrical potential (herein the GND electrical potential) within the control unit 3 is indicated by a numeral 30, and all circuits within the control unit 3 are operated on a basis of this electrical potential. A numeral 31 indicates a power source of a power to be sent to the drive detection circuit 102, and it is actually supplied from the outside, but is schematically shown with a symbol of 31. A numeral 32 schematically shows a pulse source of a pulse transmitted to the drive detection circuit 102, and it is actually made of a complex logic IC and the like. A numeral 33 indicates a differential amplifier receiving a detection signal transmitted from the drive detection circuit 102. The reference electrical potential (the GND electrical potential) within the drive detection cirucuit 102 is indicated by a numeral 1020, and all circuits within the drive detection circuit 102 are operated on a basis of this electrical potential. Further, this reference electrical potential is the reference electrical potential of the photoelectric conversion units since it is also connected to the sensor substrate 101. A numeral 1021 indicates a power source terminal and a circuit within the drive detection circuit 102 is operated by receiving the power from this power source terminal. A numeral 1022 schematically shows a logic circuit, and produces a signal for driving the sensor substrates by giving an appropriate process to the drive signal transmitted from the control unit 3. A numeral 1023 schematically shows a processing amplifier which gives an appropriate process to a signal detected by the sensor substrates and transmits it to the control unit 3. A numeral 1041 within the alternate-current separation power supply transfer unit 104 indicates an in-phase transformer and a polarity thereof is managed by a number of turns with 1 by 1. Here, an operation of this in-phase transformer 1041 will be described.

At first, direct-currently, between A and C and between B are connected, and an electrical potential difference of the between A and C turns to be 0, and an electrical potential difference of the between B and D also turns to be 0. This means that the electrical potential difference between A and B is also the electrical potential difference between C and D.

Next, alternating-currently, because of the characteristic of the transformer, the electrical potential difference of the between A and C equals the electrical potential difference between B and D. This means that the electrical potential difference between A and B is also the electrical potential difference between C and D.

That is, direct-currently and alternating-currently, the electrical potential difference of the between A and C equals the electrical potential difference of the between B and D. This indicates that an input electrical potential the between A and B is accurately transferred as an output between C and D. However, in alternating-currently, an electrical potential is free between B and D, and this indicates that the reference electrical potential is separated alternating-currently.

Accordingly, if the power source 31 within the control unit 3 is 5V, the electrical potential difference between the reference power source 1020 of the drive detection unit 102 and the power source terminal 1021 is kept as 5V. However, it could be said that the reference power source 30 within the control unit 3 and the reference power source 102 within the drive detection unit 102 are free alternating-currently.

A numeral 1052 within the alternating-current separation signal transfer unit 105 also indicates an in-phase transformer, and operates as the same as the in-phase transformer 1041. That is, a drive signal within the control unit 3 is accurately transmitted to the drive detection circuit 102, but the referece electrical potentials 30 and 1020 are separated alternating-currently. Further, a numeral 1051 within the alternating-current separation signal transfer unit 105 also indicates an in-phase transformer, and operates as the same as the in-phase transformer 1041. That is, the detection signal of the drive detection circuit 102 is accurately transmitted within the control unit 3, but alternating-currently, the referece electrical potentials 30 and 1020 are separated.

Upto this point, in order to simplify the description, a power source is just 31 only, a pulse source is just 32 only, a differential amplifier is just 33 only, are described as each for just one only, but in an actual apparatus, each has a multiple thereof and uses an in-phase transformer for each of them, respectively. But, if using the in-phase transformers for all of them, even though transmitting a plurality of power sources and signals, the reference power source of the control unit 3 and the reference power source of the drive detection unit 102, i.e., the reference power source of the photoelectric conversion unit are separated alternating-currently.

The configurations of the alternating-currently separation power supply transfer unit 204, the alternating-currently separation signal transfer unit 205, and the drive detection circuit 202 are also configured equivalent to as the alternating-currently separation power supply transfer unit 104, the alternating-currently separation signal transfer unit 105, and the drive detection circuit 102, and operate equivalently.

Next, with reference to FIG. 3, an operation of the reference power source of an entire apparatus and an influence of noise will be described. In the reference power supply wires among the wire groups, there exists resistances and these are indicated as R1, R2. In the drive detection circuit within the photoelectric conversion unit, by the operations of a logic circuit and an analog amplifier, and also within the sensor substrates, by the operation of the respective parts, dissipation currents flow, and these dissipation currents fluctuate. Since portions of these dissipation currents flow through the R1, R2 within the wire groups, an alternating-currently electrical potential difference is generated between the ends of each resistances. Because of this, an electrical potential of the GND wire 55 connected to the reference power source within the wire group 56 near the control unit 3, that is, the electrical potentials of the metal enclosure 4 connected to this GND wire 55, and the carbon fiber plate 41 and the electrical potentials at the entrances of the alternating-currently separation power source transfer units 104, 204 have alternating-currently electrical potential differences. However, as described above, by the alternating-currently separation power source transfer units 104, 204 and the alternating-currently separate signal transfer units 105, 205, the reference electrical potentials for the control sides and each of the photoelectric conversion units are alternating-currently separated, and in the photoelectric conversion unit an alternating-currently electrical potential is not to be determined from the control unit side through the wires. On the other hand, there exists the capacitances 71, 72 between the carbon fiber plate 41 and the sensor substrates 101, 201, and are connected alternating-currently. Because of this, it is apparent that the electrical potentials of the sensor substrates 101, 201 are an equipotential with the carbon fiber plates 41 alternating-currently. That is, it indicates that the carbon fiber plate 41 which is a part of the conductive enclosure and the reference electrical potential of the photoelectric conversion unit are an equipotential alternating-currently. Further, no noise current flows into the sensor currents through the capacitances 71, 72. If it does, then a path for flowing out is required, but since the photoelectric conversion units are separated alternating-currently by the alternating-currently separation power source transfer units 104, 204 and the alternating-currently separate signal transfer units 105, 205, no path for flowing out exists. This shows that no noise current flows from the carbon fiber plate 41. Also, this means that since the carbon fiber plate 41 which is tightly attached to the sensor substrates 101, 201 is equipotential with the sensor substrates 101, 201 alternating-currently even if an influence of the electrostatic noise 8 is not completely removed because of the resistance component R3 which is possessed by the metal enclosure 4, and as a result, by the carbon fiber plate 41 no current-wise noise or potential-wise noise would be received. That is, the electrostatic noises received from the resistances in other wires (not shown), floors, walls from the surroundings, and apparatuses located nearby also do not influence the outputs of the sensors. As a result of these, according to the photoelectric conversion apparatus in the present embodiment, although using the sensor substrates with the large areas. It is possible to provide the X-ray diagnosis apparatus for a medical service with a high detective ability, that is with a high S/N, which is not affected by an influence of the stray capacitance with respect to the conductive enclosure and the characteristic which is weak against a noise by forming the photoelectric conversion elements on an insulating substrate. The influence of a resistance in a wire being long because of large areas is reduced. Further, it is possible to provide a photoelectric conversion apparatus with much larger area by putting a plurality of sensor substrates together, without lessening the S/N with an undesired influence by a plurality of sensor substrates, since the reference electrical potential of each of the photoelectric conversion units does not possess an alternating-currently electrical potential difference and thus equals alternating-currently equipotential with the conductive enclosure, even if there exists a plurality of photoelectric conversion units within the same conductive enclosure.

OTHER EMBODIMENTS

Figure 5:
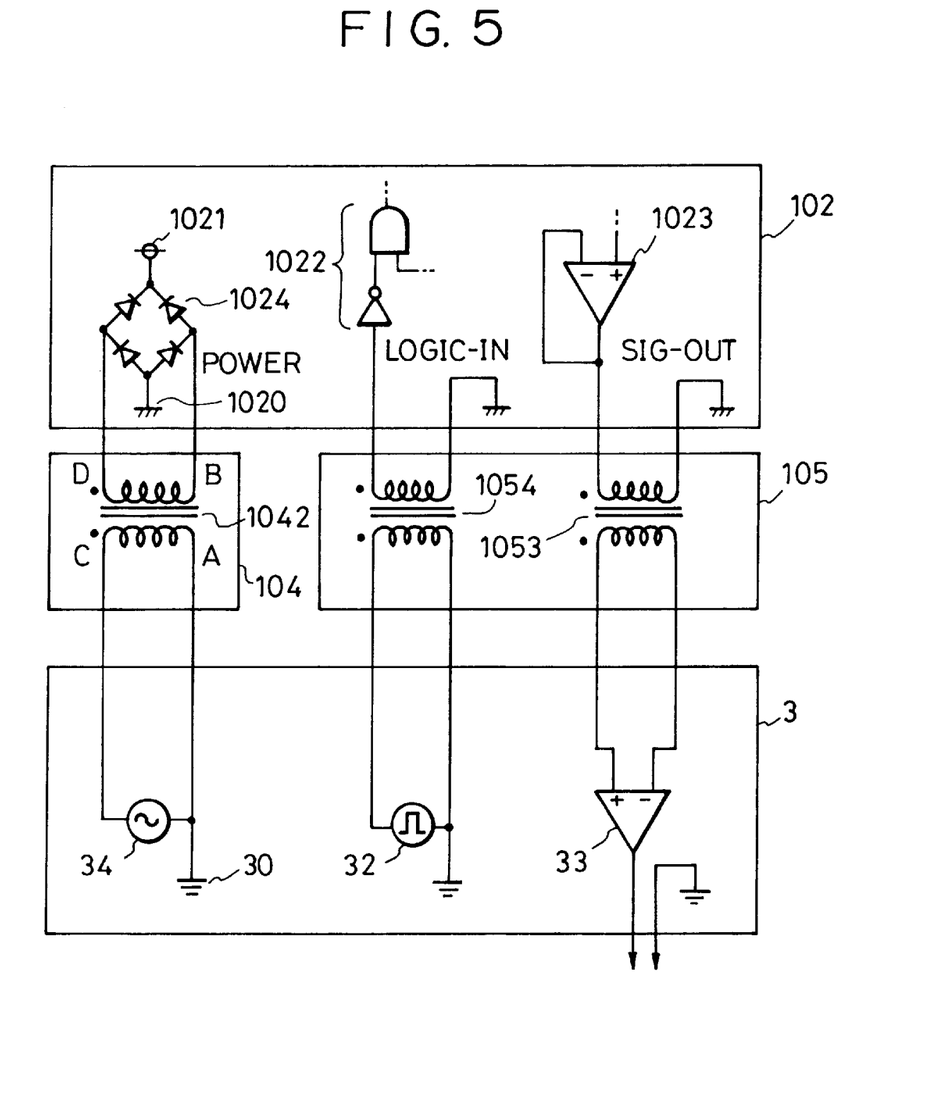
FIG. 5 is a schematical circuit diagram illustrating one example of a circuit configuration suitable for the photoelectric conversion apparatus according to the present invention.

FIG. 5 shows configurations of the drive detection circuit 102, the control unit 3, the alternating-currently separation power source transfer unit 104 and the alternating-currently separation signal transfer unit 105 of other preferred photoelectric conversion apparatus according to the present invention. The same components as in FIG. 4 are marked with the same symbols. In FIG. 5, the transformers within the alternating-currently separation power source transfer unit 104 and the alternating-currently separation signal transfer unit 105 have the rotational relation of 90 degrees with respect to the transformers in FIG. 4, and are indicated as 1042, 1054 and 1053, respectively. An operation will be described with reference to the transformer 1042 within the alternating-currently separation power source transfer unit 104. As a characteristic of the transformer, an alternating-currently electrical potential between C and A is transmitted to between D and B. Further, between A and B and between C and D are separated alternating-currently as well as direct-currently. A difference from the one shown in FIG. 4 is to be separated direct-currently as well, and accordingly, no direct-current electrical potential can be transmitted. Therefore, the power source 34 within the control unit 3 turns to be an alternating-currently power source, and a power of the direct-current power source is obtained by transmitting it with the transformer 1042, and by rectifying it with the drive transmission circuit 102. Non transmission of a direct-current is equally applied to the transformer 1054 within the alternating-currently separation signal transfer unit 105, and it is necessary to put some thought in the pulse source 32 for use in the sensor drive as not need to transmit a direct-current. For example, it only needs to implement a pulse modulation with a bi-phases. The pulse modulation with the bi-phases is a method which is generally used for transmitting the digital signals, and is a method for transmitting the digital signals including a direct-current, with only an alternating-currently not including a direct-current. It is a method of taking an exclusive OR of a clock signal (so-called basic clock) of the maximum frequency which turns to be a fundamental of a logic within the control unit 3 and a signal to be transmitted, and modulating it, then within the drive detection circuit 102, similarly taking an exclusive OR with the basic clock, and demodulating it. Similarly, a sensor detection signal is also transmitted by the transformer 1053, and thus this is also modulated, and a direct-current is reproduced with a timing of a basic output. In the present embodiment, as similar to the previous embodiment, the effect for noises is the same since the reference electric potential 30 within the control unit 3 and the reference electric potential within the drive detection circuit 102 are separated alternating-currently. In this example, since it is also separated direct-currently, it would be effective for a case of desiring to provide an electrical potential difference direct-currently to the photoelectric conversion units and the control unit, in some reason. This has an advantage such as not influencing the control unit even if the sensor substrate electrical potential is risen when detecting a light emission of the flourescent material by charged particles.

Figure 6:
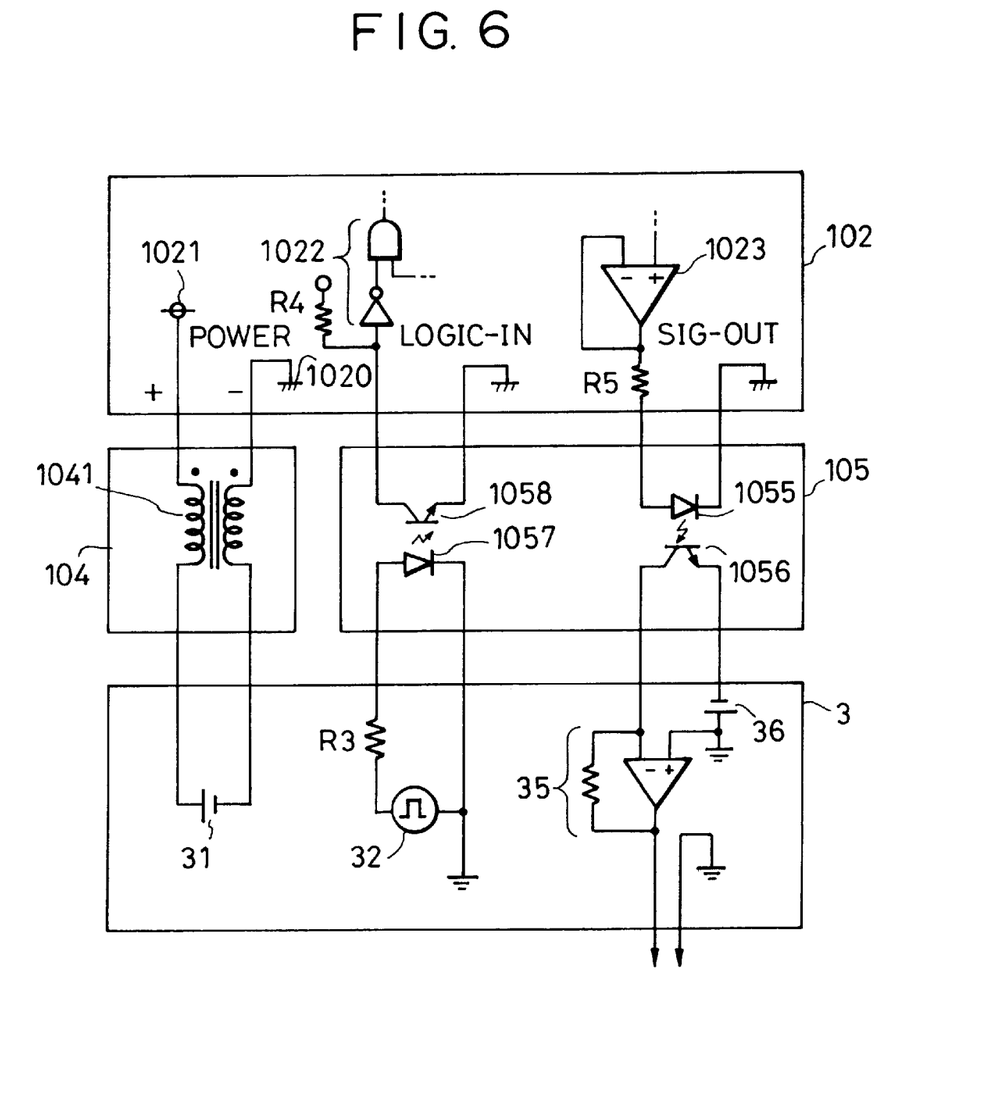
FIG. 6 is a schematical circuit diagram illustrating one example of a circuit configuration suitable for the photoelectric conversion apparatus according to the present invention.

FIG. 6 shows configurations of the drive detection circuit 102, the control unit 3, the alternating-current separation power source transfer unit 104 and the alternating-current separation signal transfer unit 105 of other preferred photoelectric conversion apparatus according to the present invention. The same components as in FIG. 4 are marked with the same symbols. In FIG. 6, in the alternating-current separation signal transfer unit 105, a light-coupling element (photo-coupler) by an LED and a photo-transistor is used. R4 is a resistance for supplying a bias to the photo-transistor, and R3 and R5 are control resistances for controlling a current to the LED. Further, a numeral 36 indicates a power source for providing a bias to the photo-transistor, and a numeral 35 indicates a current-voltage conversion circuit for detecting a current flowing through the photo-transistor. The alternating-currently separation signal transfer unit 105 in this embodiment can transfer a signal including a direct-current, an alternating-currently, and also implements a separation of the reference electric potential for a direct-current, and an alternating-currently. However, an in-phase transistor 1041 is used for the alternating-currently separation power source transfer unit 104 in this embodiment is not efficient to transmit the power with the light coupling element. Instead, since the power source 31 is not connected to the reference electric potential within the control unit 3, the reference electric potential within the control unit 3 and the reference electric potential within the drive detection circuit 102 are separated both alternating-currently and direct-currently. However, since a transmission of the power by the ligh-coupling element is not impossible, it needs to use the ligh-coupling element for the alternating-currently separate power source transfer unit 104 if it is desired to completely separate the direct-current, the alternating-current. In the present embodiment, as similar to the previous embodiment, the effect for noises is the same since the reference electric potential 30 within the control unit 3 and the reference electric potential within the drive detection circuit 102 are separated alternating-currently. In this example, since it is also separated direct-currently, it would be effective for a case of desiring to provide an electrical potential difference direct-currently to the photoelectric conversion units and the control unit, in some reason. Furthermore, since the signal is transmitted both direct-currently and alternating-currently, a complex circuit such as of a modulation is not required.

Figure 7:
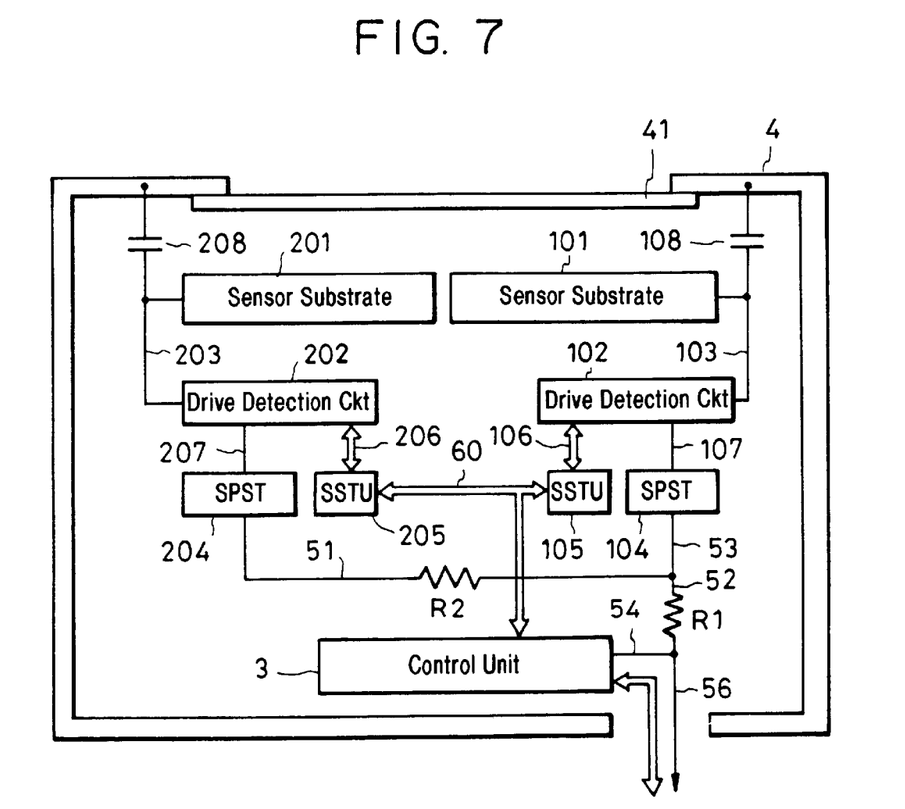
FIG. 7 is a schematical cross-sectional diagram illustrating one example of the photoelectric conversion apparatus according to the present invention.

FIG. 7 shows other preferred photoelectric conversion apparatus according to the present invention. In FIG. 7, the same components as in FIG. 3 are marked with the same symbols, and the description thereof will be omitted. A different point from FIG. 3 is that the metal enclosure 4 and the reference electrical potentials within the wire groups 103, 203 within the photoelectric conversion units are coupled by the capacitances 108, 208. With this, the reference electrical potentials within the sensor substrates 101, 201 and the electrical potential of the conductive enclosure are more secured and turned to be much stronger against the noise. Furthermore, in this embodiment, the reference electrical potentials within the wire groups 56 and the metal enclosure 4 are not connected. This is an effective method for reducing the influence of noise of a fluctuation of the reference wire near the control unit 3 rather than electrostatic noise from the outside.

Figure 8:
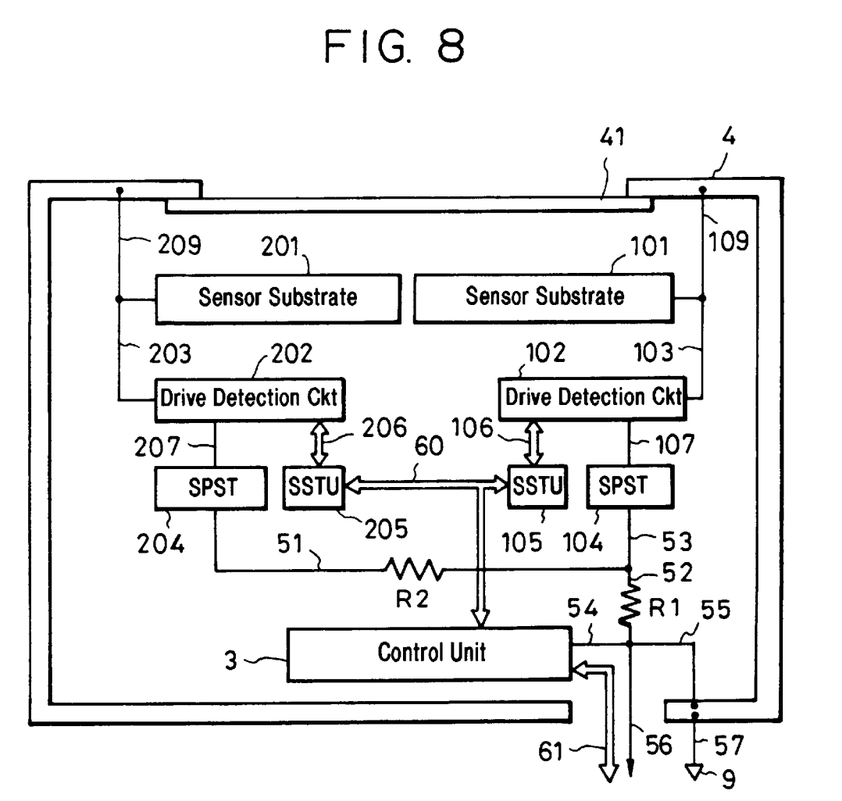
FIG. 8 is a schematical cross-sectional diagram illustrating one example of the photoelectric conversion apparatus according to the present invention.

FIG. 8 shows other preferred photoelectric conversion apparatus according to the present invention. In this embodiment, the reference electrical potentials within the photoelectric conversion units and the metal enclosure 4 are completely equipotential by the wires 109, 209. Accordingly, the reference electrical potentials within the sensor substrates 101, 201 and the electrical potential of the conductive enclosure are completely matched and are much stronger against the noises. Further, by being connected with the ground 9 through the wire 57, a path is secured for preventing flow of a current through the photoelectric conversion unit and for bypassing it to the ground, for example, even when charges are added to the metal enclosure 4 instantaneously by the discharges according to the electrostatic.

Now, it will provide a supplement for an alternating-currently separation which has been used up to this point. For an operation of an implementation it is difficult to make a complete alternating-currently separation until reaching to a low frequency, and herein the effect will be created if a frequency of noise to the subject could be separated. That is, assuming that reading an image by 30 frames per second with the photoelectric conversion apparatus of the two-dimension and one frame is 500 lines, then it will read 15000 lines per second. Here, in order to reduce the noises as subjecting the noises between lines, there would be an effect if the signals equal to or more than 15000 Hertz, i.e., 15 kHz can be separated. On the other hand, in order to reduce the noises as subjecting the noises of the fluctuations between frames, it needs to prepare the alternating-currently separation power source transfer unit and the alternating-currently separation signal transfer unit which can separate equal to or more than 30 Hertz.

As described above, according to the present invention, it is possible to provide a photoelectric conversion apparatus, with a high detection ability, i.e., with a high S/N, including: a photoelectric conversion unit having a drive detection circuit for driving a sensor substrate of which a plurality of photoelectric conversion elements are arranged on an insulating substrate and the photoelectric conversion elements, and for detecting signals from the photoelectric conversion elements; and a control unit for controlling the photoelectric conversion unit, by alternating-currently separating a reference electrical potential of the photoelectric conversion unit and a reference electrical potential of the control unit. Further, by converting to the light, directly with the photoelectric conversion elements within the apparatus, or with a fluorescent material, the radioactive rays, in particular by detecting the X-rays, a non-destructive inspection apparatus such as the X-ray image pickup apparatus for the medical service with a high quality can be provided.

In addition, according to the present invention, a system which is strong against the noises can be provided by alternating-currently separating the reference electrical potential of the photoelectric conversion unit and the reference electrical potential of the control unit.

It is apparent that the present invention can be appropriately modified, or combined within the scope of the invention.

What is claimed is:

1. A photoelectric conversion apparatus, comprising:

an insulating substrate comprising a photoelectric conversion unit, said photoelectric conversion unit comprising a plurality of photoelectric conversion elements arranged on said insulating substrate and a drive detection circuit for driving the photoelectric conversion elements, and for detecting signals from said photoelectric conversion elements; and a control unit for controlling said photoelectric conversion unit, wherein a reference electrical potential of said photoelectric conversion unit and a reference electrical potential of said control unit are alternating-currently separated.

2. A photoelectric conversion apparatus, according to claim 1, wherein at least said photoelectric conversion unit is arragned within a conductive enclosure.

3. A photoelectric conversion apparatus, according to claim 1, comprises a plurality of said photoelectric conversion units.

4. A photoelectric conversion apparatus, according to claim 1, comprises a transmission element for transmitting a control signal and a detection signal, while alternate-currently separating said reference electrical potential of said photoelectric conversion unit and said reference electrical potential of said control unit, between said photoelectric conversion unit and said control unit.

5. A photoelectric conversion apparatus, according to claim 4, wherein said transmission element is a transistor element.

6. A photoelectric conversion apparatus, according to claim 4, wherein said transmission element is an optical coupling element.

7. A photoelectric conversion apparatus, according to claim 2, wherein said reference electrical potential of said photoelectric conversion unit and an electrical potential of said conductive enclosure are alternate-currently connected.

8. A photoelectric conversion apparatus, according to claim 2, wherein said reference electrical potential of said photoelectric conversion unit and an electrical potential of said conductive enclosure are direct-currently connected.

9. A photoelectric conversion apparatus, according to claim 2, wherein said electrical potential of said conductive enclosure and an external reference electrical potential are direct-currently connected.

10. A photoelectric coversion apparatus, according to claim 1, wherein said reference electrical potential of said photoelectric conversion unit and said reference electrical potential of said control unit are alternate-currently separated as well as direct-currently separated.

11. A photoelectric conversion apparatus, according to claim 1, wherein said photoelectric conversion element is an element capable of detecting a radioactive ray.

12. A photoelectric conversion apparatus, according to claim 1, further comprising a wavelength conversion material for converting a radioactive ray to a wavelength that the photoelectric conversion element is capable of sensing on the photoelectric conversion element.

13. A photoelectric conversion apparatus, according to claim 12, wherein said wavelength conversion material includes a fluorescent material.

14. A photoelectric conversion apparatus, comprising:

a photoelectric conversion unit comprising a plurality of photoelectric-conversion elements, and a drive detection circuit being driven with a first reference electrical potential for driving said photoelectric conversion elements, and for obtaining outputs from said photoelectric conversion elements; and a control unit comprising a circuit, being provided separately from said photoelectric conversion unit, controlling the photoelectric conversion unit, and being driven with a second reference electrical potential, wherein, said first reference electrical potential and said second reference electrical potential are alternating-currently separated.

15. A photoelectric conversion apparatus, according to claim 14, wherein at least said photoelectric conversion unit is arranged within a conductive enclosure.

16. A photoelectric conversion apparatus, according to claim 14, further comprising a wavelength conversion material that includes a fluorescent material, the wavelength conversion material for converting a radioactive ray to a wavelength that the photoelectric conversion element is capable of sensing on the photoelectric conversion element.

* * * * *

UNITED STATES PATENT AND TRADEMARK OFFICE
CERTIFICATE OF CORRECTION

PATENT NO. : 6,191,411 B1
DATED : February 20, 2001
INVENTOR(S) : Noriyuki Kaifu It is certified that error appears in the above-identified patent and that said Letters Patent is hereby corrected as shown below:

Title page,
Item [57], ABSTRACT,
Line 9, "the the" should be -- the --.

Column 1,
Line 22, "cam corder" should read -- camcorder --;
Line 44, "one the" should read -- one of the --;
Line 49, "exposure" should read -- exposed --;
Line 54, "readily to" should read -- readily --;
Line 56, "signal not" should read -- signal --;
Lines 64 and 66, "noises" should read -- noise --;
Line 67, "the the" should read -- the --.

Column 2,
Line 5, "high" should read -- higher --;
Line 51, "amorphours-silicon" should read -- amorphous-silicon --.

Column 3,
Line 16, "minature" should read -- miniature --;
Line 26, "minature" should read -- miniature --.

Column 4,
Line 47, "a noise" should read -- noise --.

Column 6,
Line 15, "idential" should read -- identical --;
Line 22, "Thereby the" should read -- Thereby --.

Column 7,
Line 25, "phoelec-" should read -- photoelectric --.

Column 9,
Line 16, "indicates" should read -- indicates --.

Column 10,
Line 1, "cirucuit 102" should read -- circuit 102 --;
Lines 34, 35 and 36, "of the between" should read -- between --;
Line 48, "alternating-current" should read -- alternating currently --;
Line 50, "as the" should read -- the --;
Line 53, "reference" should read -- reference --.

UNITED STATES PATENT AND TRADEMARK OFFICE
CERTIFICATE OF CORRECTION

PATENT NO. : 6,191,411 B1
DATED : February 20, 2001
INVENTOR(S) : Noriyuki Kaifu It is certified that error appears in the above-identified patent and that said Letters Patent is hereby corrected as shown below:

Column 11,
Line 46, "are an" should read -- are --;
Line 51, "are an" should read -- are --.

Column 13,
Line 23, "alternating-current" should read -- alternating-currently --;
Line 34, "alternating-currently," should read -- alternating-current, --;
Line 36, "alternating-currently." should read -- alternating-current. --;
Lines 46 and 47, "ligh-coupling" should read -- light-coupling --.

Column 14,
Line 5, "against the" should read -- against --.

Signed and Sealed this

Twenty-third Day of March, 2004

JON W. DUDAS
*Acting Director of the United States Patent and Trademark Office*